United States Patent
Burzio et al.

(10) Patent No.: US 6,292,039 B1
(45) Date of Patent: Sep. 18, 2001

(54) INTEGRATED CIRCUIT PHASE-LOCKED LOOP CHARGE PUMP

(75) Inventors: Marco Burzio, Turin; Emanuele Balistreri, Battipaglia, both of (IT)

(73) Assignee: Telecom Italia Lab S.P.A., Turin (IT)

( * ) Notice: Subject to any disclaimer, the term of this patent is extended or adjusted under 35 U.S.C. 154(b) by 0 days.

(21) Appl. No.: 09/597,058

(22) Filed: Jun. 20, 2000

(30) Foreign Application Priority Data

Jun. 22, 1999 (IT) .............................................. TO99A0532

(51) Int. Cl.[7] .......................................................... H03C 7/06
(52) U.S. Cl. ............................................. 327/157; 375/376
(58) Field of Search .................................... 327/157, 156, 327/159; 331/DIG. 2; 375/376

(56) References Cited

U.S. PATENT DOCUMENTS 5,307,028 * 4/1994 Chen ...................................... 327/157
5,602,794 * 2/1997 Javanifard et al. .................. 327/148

* cited by examiner

Primary Examiner—Kenneth B. Wells
Assistant Examiner—Linh Nguyen
(74) Attorney, Agent, or Firm—Herbert Dubno

(57) ABSTRACT

A charge pump (2) is supplied to reset in rated conditions the error signal of a phase-locked loop of the type whereby a phase detector (1) periodically supplies this pump (2) with a first and second impulse having emission instants dependent on the phase ratio between phase-locked loop input signals and are allocated to control circuit output increase or decrease respectively by means of ring filter (3a, 3b). The pump features loops (21, 22, 23, 24, 28) to transform the first and second impulse into a first and second voltage signal of longer duration than maximum impulse duration and featuring values the difference of which depends on the phase ratio between the loop input signals and to generate a signal in a current representative of such difference.

11 Claims, 5 Drawing Sheets

US 6,292,039 B1

INTEGRATED CIRCUIT PHASE-LOCKED LOOP CHARGE PUMP

This invention refers to CMOS technology analog integrated circuits and more in particular to a charge pump to be used in a phase-locked loop (PLL) constructed as an integrated item in this technology.

The charge pump is a loop used to cancel the PLL error signal in rated conditions. The pump is typically connected between the phase comparator (or phase and frequency comparator) and the PLL ring filter and essentially consists of a current generator receiving increase and decrease impulses from the comparator and causing a variation to filter capacitor proportional to any difference in duration of such impulses. Greater details on phase-locked loops are available in documents "Low-Jitter Process Independent DLL and PLL Based on Self-Biased Technique", by J. G. Maneatis, IEEE Journal of Solid State Circuit, Volume 31, Number 11, November 1996, pages 1723 and following and "Fully Integrated CMOS Phase-Locked Loop with 15 to 240 MHz Locking Range and ±50 ps Jitter" by 1. Novof et al., ISCCC Digest Technical Papers, pages 112 and following, February 1995. Both documents also describe differential control structures for the PLL oscillator.

The charge pump is generally desired to start operating even for small loop input phase errors and its sensitivity is therefore an important requirement. Small phase errors correspond to a very small difference in duration between the two impulses supplied to the pump and therefore a very short duration ring filter control signal. In implementing the pump as an integrated circuit, due to the unavoidably far from ideal circuit component features, it was found that correction introduced in case of very short impulses cannot be forecast and is therefore difficult to control. Furthermore, if the PLL oscillator is controlled in the differential mode—a solution normally adopted to reduce jitter—the effects due to each of the control signals are summed together and increase correction indeterminateness.

A further problem is the fact that the filter contains a relatively small capacity capacitor, because of technological reasons dependent on integration processes. It follows that the resistance in the filter must in principle be relatively high for reasons of stability, which can cause system malfunctioning additional to the indeterminateness introduced by the too short duration of filter control signals.

This last problem was solved by providing resistor-less filters and supplying the loop oscillators with an additional control generated by a supplementary pump for instance, as described in the two documents mentioned above, particularly the one by Novof et al. This control signal would however be a short duration impulse signal, which disturbs oscillator operation.

According to this invention a charge pump is however supplied, which eliminates the need to supply very short impulses to the ring filter and oscillator.

According to the invention, the pump allocated to generating a current signal for controlling at least the ring filter in a phase-locked loop where a phase detector periodically gives such pump a first and second impulse whose emission instants depend on the loop input signal phase ratio and are allocated to control loop output magnitude increase or decrease respectively is characterized by the fact that it includes:

a logic network for recognizing the simultaneous presence of such first and second impulse and generating a third impulse representative of such simultaneous presence a delay element receiving such third impulse and re-emitting it after a preset period of time longer than the minimum duration of such first and second impulse and shorter than the repetition period of such impulses a first and second integrator circuit respectively actuated by the first and second impulse are deactivated by such third impulse and generate signals whose amplitude is tied to the emission instant of such first and second impulse and whose duration depends on such emission instant and the duration of the preset time interval subtraction means connected to the output of the first and second integrator circuit and suitable to generate at least a first value and sign current signal representative of any difference in amplitude between the output signals of such two integrator circuits.

The invention also concerns a process for generating ring filter control current signals by using the pump according to the invention, characterized by the fact that it contains operations for:

recognizing the simultaneous presence of such first and second impulse and generating a third impulse representative of such simultaneous presence delaying such third impulse for a preset period of time longer than the minimum duration of such first and second impulse and shorter than the period of such impulses converting such first and second impulse into a respective first and second voltage signal whose amplitude is tied to the emission instant of such first and second impulse and whose duration depends on such emission instant and the duration of the preset time interval obtaining from such first and second voltage signal at least a first current signal representative of their difference, for ring filter control.

Reference is made to the enclosed drawing, for greater clarification, where:

Figure 1:
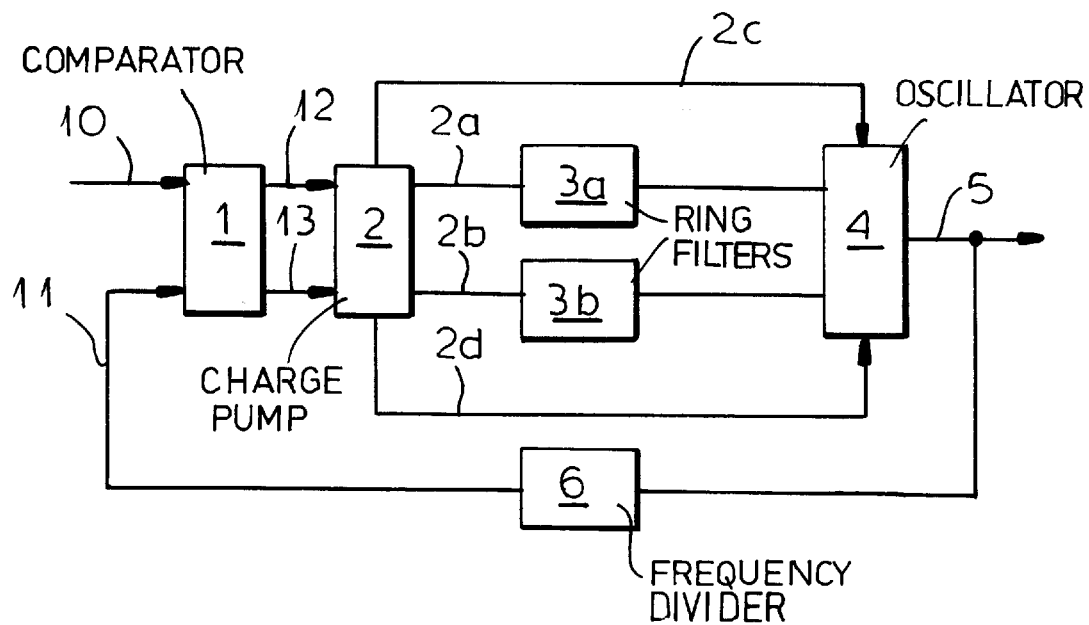
FIG. 1 is the general diagram of a differential structure phase-locked loop.

With reference to FIG. 1, a phase-locked loop essentially consists of:

a phase (or phase and frequency) comparator 1, receiving the reference signal with which it must lock at a first input 10 and the signal to control at a second input 11, generating on outputs 12, 13 a pair of voltage impulses (hereafter also referred to as impulses U, D), whose duration averaged over the period expresses input signal phase difference, a charge pump 2 generating a pair of complementary current signals on outputs 2a, 2b, whose average value is tied to the difference in duration of the two impulses U, D, a pair of ring filters 3a, 3b each associated to one of pump 2 outputs 2a, 2b receiving a the signal present on the corresponding output; the filters are considered as only consisting of capacitors as resistance functions are simulated by a suitable connection between the pump and the oscillator, oscillator 4 piloted both by ring filter output signals 3a, 3b and by a pair of further complementary signals on wires 2c, 2d from the current pump to compensate for the lack of resistance in filters 3a, 3b and allocated to generating the loop output signal, a first frequency divider 6 acting on oscillator output signal 5 whose output is brought to the second input of comparator 1.

Figure 2:
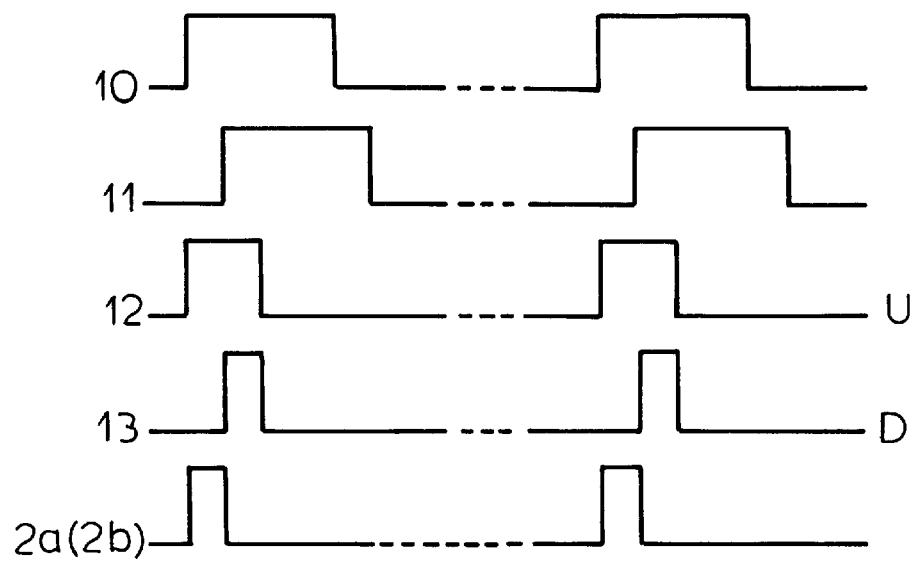
FIG. 2 is a figure diagram of conventional pump input/output signals.

FIG. 2 shows the input and output signals of a conventional pump, with reference to one filter 3a, 3b. It is postulated that the signal on wire 11 is delayed with respect to the signal on wire 10, so impulse U on wire 12 precedes the impulse on wire 13 by a time α equivalent to phase difference; impulses U and D remain present simultaneously for a time Δ. In typical PLL applications such as frequency synthesizers or clock signal recovery circuits, charge pump 2 must operate correctly at values of α lower than 10 ps and the values of Δ can be of several hundred picoseconds (e.g. 400 ps). The impulsive character of the signal present in pump 2 outputs is thus obvious.

Figure 3:
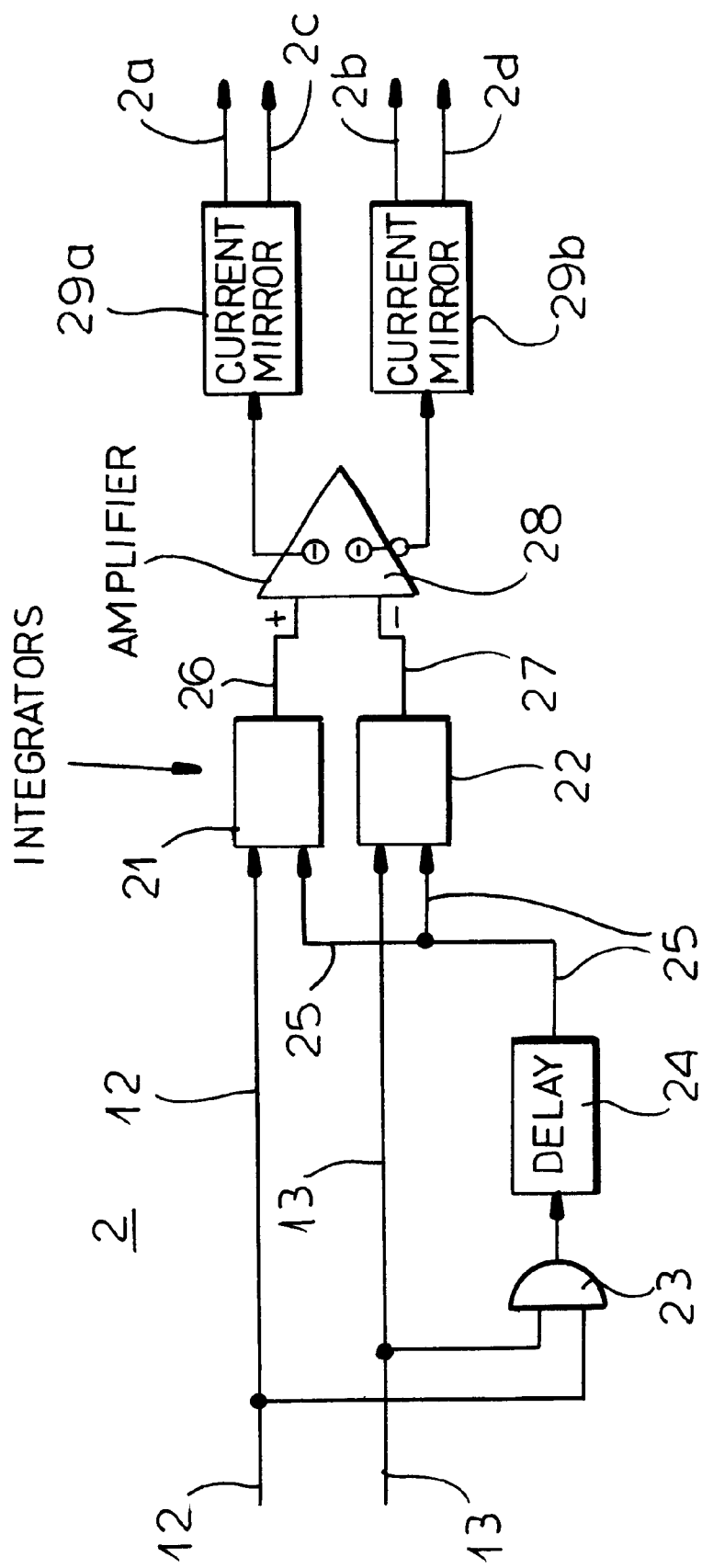
FIG. 3 is the block diagram of the charge pump covered by the invention.

FIG. 3 gives a functional diagram of the pump. Impulses U, D present on comparator 1 outputs 12, 13 are respectively supplied to a first input (charge input) of a pair of integrator circuits 21, 22 and to the two inputs of an AND gate 23 whose output is connected to a delay element 24 (such as a pair of inverters for instance) suitable to introduce onto the signal supplied by the AND gate a delay $t_o$ which must be longer than the period of simultaneous presence of the two impulses U, D and therefore than the duration of the shorter of the two, account being taken that these end at the same instant. This duration is the "minimum duration" mentioned in the presentation of the invention and in the claims.

Delay element 24 output 25 is in its turn connected to a second input (discharge input) of the two integrators 21, 22. Integrator outputs 26, 27 are brought respectively to the two inputs of a differential amplifier 28, associated to means for generating a pair of complementary current output signals (still considering the case of a differential output), each proportional to phase difference. For ease of drawing reference, these means are indicated by the current generator symbol inside the amplifier. Amplifier output signals 28 are in their turn supplied to respective current mirror systems 29a, 29b, suitable to supply two different current output signals, these being respectively filter control signals 3a, 3b and additional control signals for the oscillator.

For ease of drawing reference, the means for adjusting common mode voltage of the differential structure part has not been shown. These means are provided on all circuits having this structure and present no innovative characteristic, so their description is unnecessary. An example of their implementation is anyhow described in the article by Novof et al. mentioned above.

Figure 4:
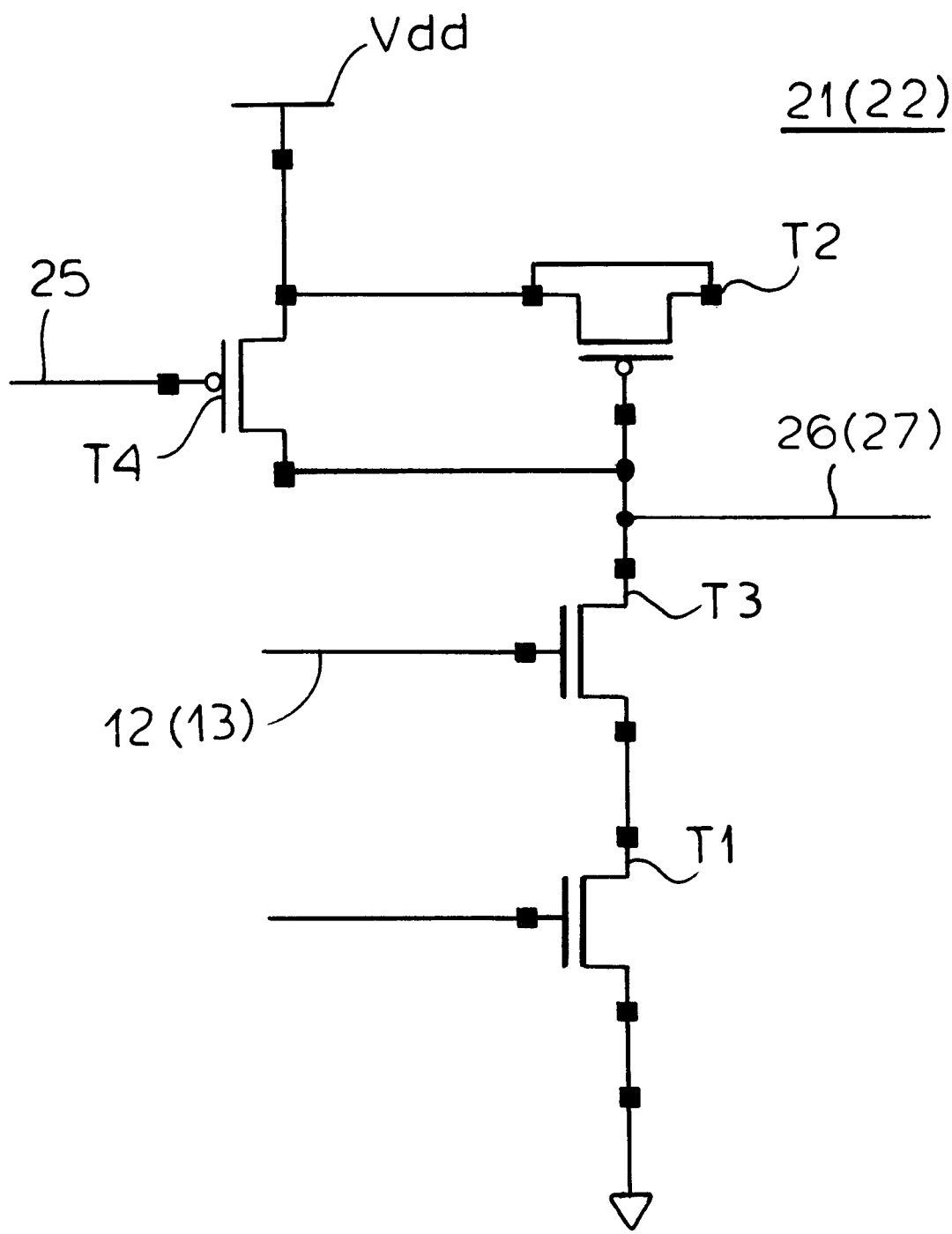
FIG. 4 is the circuit diagram of an element of the charge pump covered by the invention.

As can be appreciated from FIG. 4, CMOS technology circuits 21, 22 include:

a first type n transistor T1 making up a current generator and provided with a grounded source electrode, a second type p transistor T2 making up a capacitor and provided with a plate connected to voltage Vdd, a third and fourth transistor T3, T4 acting as switches, the first brought to conduction by the signal U (or respectively D) present on wire 12 (or respectively 13) and the second brought to conduction by the discharge signal present on wire 25.

Figure 5:
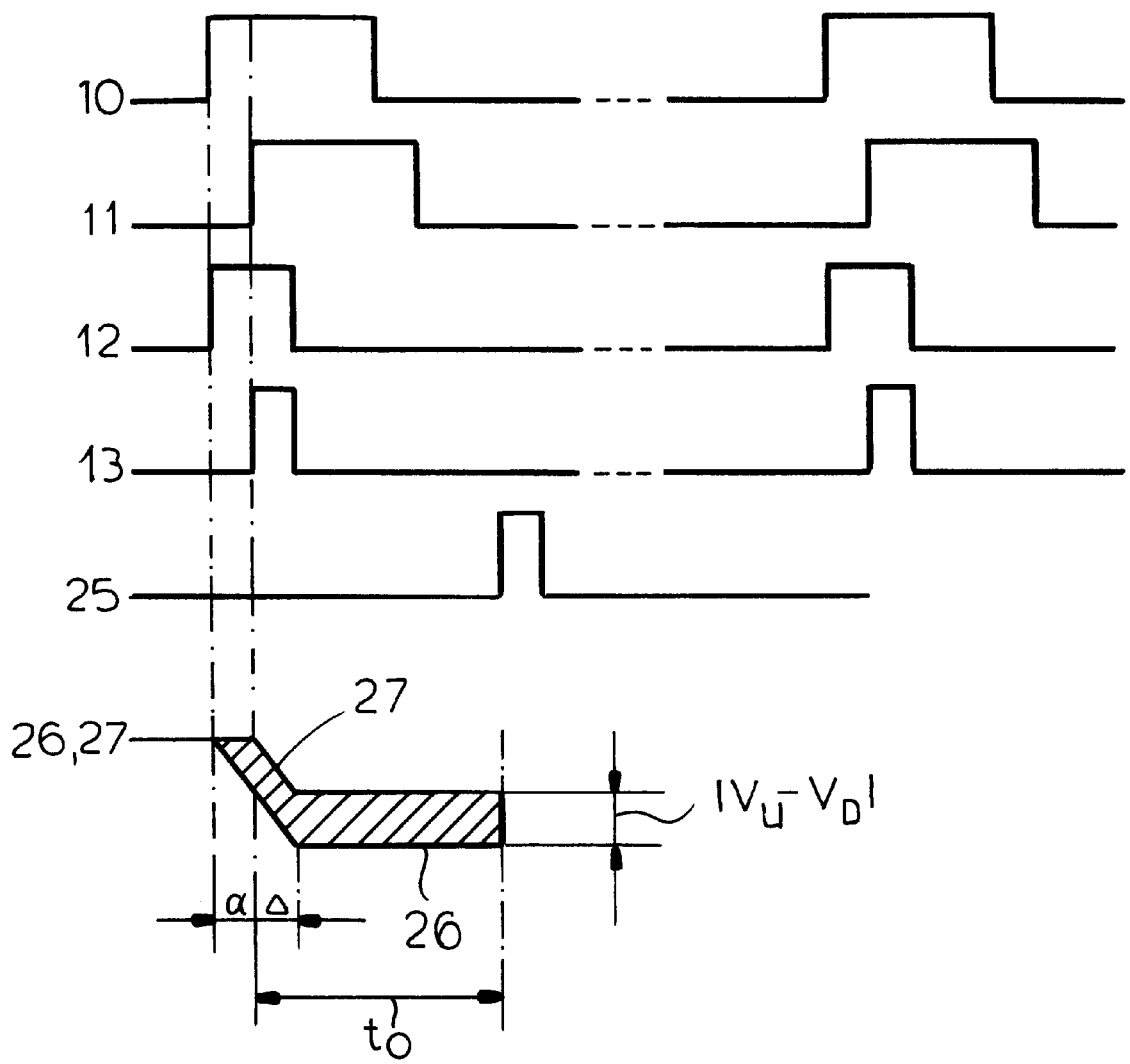
FIG. 5 is a diagram illustrating operation of the invention.

FIG. 5 shows the trend of signals generated by circuits 21, 22 in the same phase difference considered for FIG. 2. Signals on lines 10 to 13 are therefore the same as those of FIG. 2. Lines 25 and 26–27 show the behavior of tension on the wires with the name number. The two signals on wires 26, 27 are shown overlapping to better illustrate operation of the invention. Circuit 21 is activated at the arrival of signal U; transistor T3 conducts and capacitor T2 starts to charge through current generator T1. Tension present on wire 26 decreases linearly until it reaches a minimum value of $V_u$ at the end of the duration of impulse U. With delay α, the same situation occurs for circuit 22, whose capacitor T2 charges, so voltage on wire reaches a value of $V_D$. At the end of interval Δ, switches T3 of the two circuits open and since transistors T4 are disabled, and voltages $V_U$, $V_D$ remain unchanged until the end of interval $t_o$, when the signal generated by delay element 24 arrives. For all this time, differential amplifier 28 generates a signal proportional to $V_U$–$V_D$ (or a pair of complementary signals each proportional to $V_U$–$V_D$ in case of a differential output) and therefore to the phase difference used to control the filter. At the end of interval to, the signal on wire 25 brings transistors T4 to conduction and capacitors T2 therefore discharge and return to initial voltage Vdd.

The above clearly applies, mutatis mutandis, to when impulse D precedes impulse U.

Circuits 21, 22 are practically time-voltage converters; the difference between generation instants of signals U and D is in actual fact transformed into voltage difference [$V_U$–$V_D$] that lasts for a time that can be as long as required (obviously as long as it is shorter than the period of signals on wires 10 and 11) and is given by the sum of maximum duration of impulses U, D and time to. Rapid response is only required at the level of circuits 21, 22 that can consist of T1–T4 components to boost performance in terms of velocity as they have to generate control signals only used locally and from which no great robustness is required.

Figure 6:
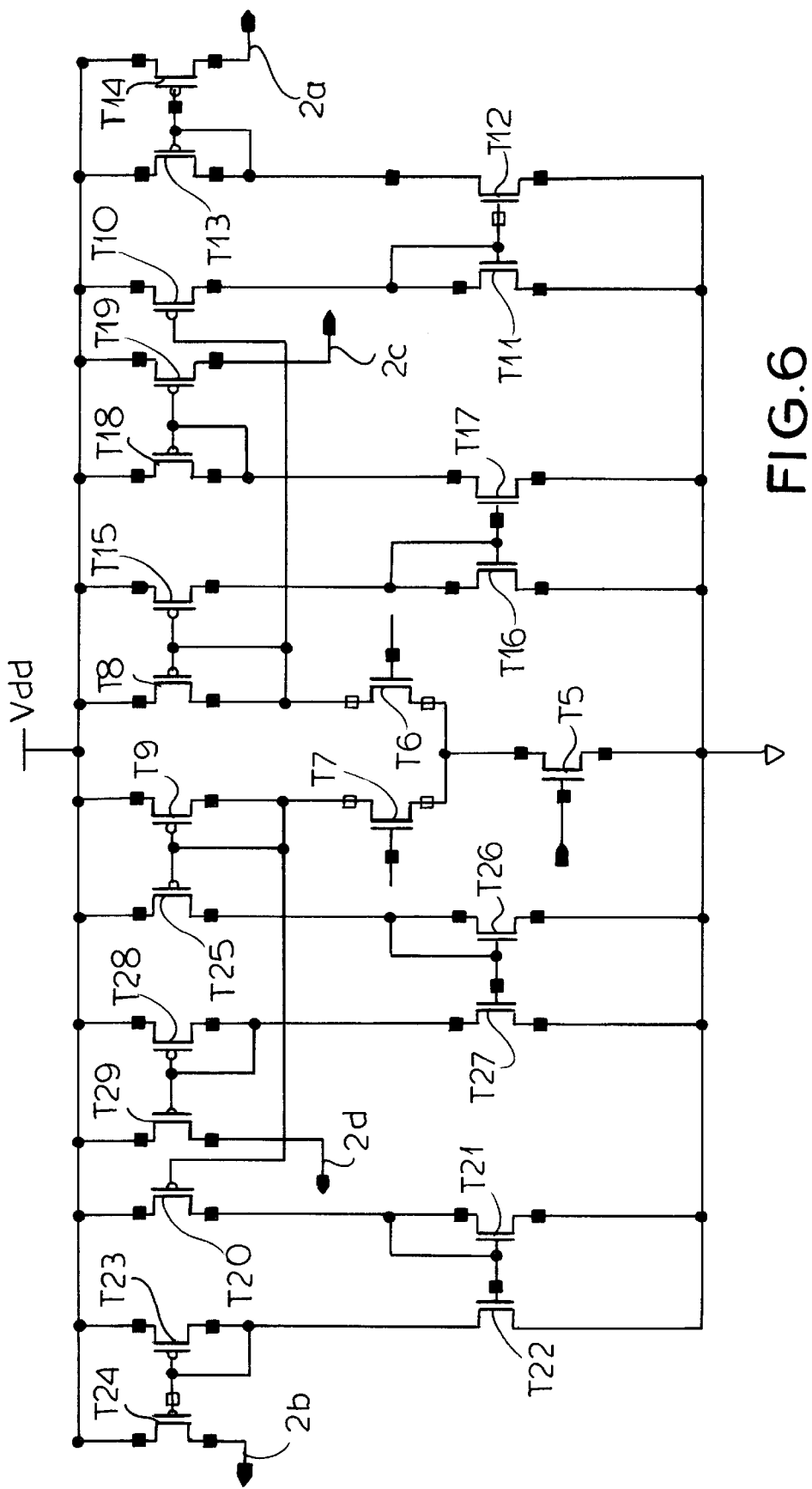
FIG. 6 is the circuit diagram of another element of the charge pump covered by the invention.

FIG. 6 shows the circuit of differential amplifier 28 (inclusive of transistors T5–T9) and current mirror systems 29a, 29b (inclusive of transistors T10–T19 and T20–T29 respectively) each consisting of a pair of mirrors each provided with a pair separation stage. The two mirrors of each pair are allocated to generate current signals on outputs 2a, 2c and 2b, 2d respectively.

In particular, for generating the signal on wire 2a, amplifier transistor T8 output voltage is applied to the gate of mirror transistor T10, whose drain current is then transformed into output current through pair separating stage T11–T13 and transistor T14. Similarly, for generation of current on wire 2c, amplifier transistor T8 output voltage is applied to the gate of mirror transistor T15, whose drain current is then transformed into output current through pair separating stage T16–T18 and transistor T19. The same layout is repeated for generating current on wires 2b, 2d starting from transistor T9 voltage.

It should be noted that output current could theoretically by picked up directly by transistors T10, T15 or T20, T25 respectively (which therefore make up the current generators shown inside block 28 of FIG. 2). These transistors must however have substantially similar characteristics to those of transistors T8, T9, which are small to ensure sufficiently fast response and transistors T10, T15 or T20, T25 would not feature satisfactory behavior as current generators. This is the reason why it was considered advisable to introduce mirrors T11–T14, T16–T19 (T21–T24, T26–T29).

It is obvious that the above description is only given as a non-limiting example and that variations and modifications are possible without leaving the field covered by the invention. In particular, even though reference was made to a ramp that decreases from Vdd to $V_D$ or $V_U$ for the differential amplifier piloting signal, the opposite solution can obviously be adopted, with a ramp increasing from the ground value. Circuit modifications to the diagrams of FIGS. 4 and 6 are obvious for technicians.

What is claimed is:

1. Phased-locked loop charge pump for the generation of current signals for the control of a phase-locked loop in which a phase detector (1) periodically supplies such pump (2) with a first and second impulse whose emission instants depend on input signal phase ratio and are allocated to respectively control the increase or decrease of loop output magnitude characterized by the fact that it includes:

- logic network (23) for recognizing the simultaneous presence of such first and second impulse and generating a third impulse representative of such simultaneous presence
- delay element (24) receiving such third impulse and re-emitting it after a preset period of time longer than the minimum duration of such first and second impulse and shorter than the repetition period of such impulses
- first and second integrator circuit (21, 22) respectively actuated by the first and second impulse which are deactivated by such third impulse and generate signals whose amplitude is tied to the emission instant of such first and second impulse and whose duration depends on such emission instant and the duration of the preset time interval
- subtraction means (28) connected to the output of the first and second integrator circuit (21, 22) and suitable to generate at least a first value and sign voltage signal representative of any different amplitude between the output signals of such two integrator circuits (21, 22) to be supplied to phase-locked loop ring filter(s) (3a, 3b).

2. A pump according to claim 1, characterized by the fact that such subtraction means (28) are suitable to generate a second voltage signal supplied directly to oscillator (4) of the phase-locked loop to simulate the resistance of filter(s) (3a, 3b).

3. A pump according to claim 1 characterized by the fact that such subtraction means consist of a voltage output differential amplifier (28).

4. A pump according to claim 3 characterized by the fact that such differential amplifier (28) is associated to a least one current mirror element (29a, 29b) including a first and a second mirror (T10–T14, T15–T19; T20–T24, T25–T29) for generating first and second current signal.

5. A pump according to claim 1 characterized by the fact that such differential amplifier (28) is associated to a pair of current mirror elements (29a, 29b) for generating a first and second and respective complementary signals.

6. A pump according to claim 1 characterized by the fact that such integrator circuits (21, 22) include:

a current generator (T1)
a capacitor (T2) and
a pair of switches (T3, T4) the first being closed by the first or respectively the second increase impulse and the second being closed by the third impulse.

7. A pump according to claim 6 characterized by the fact that such capacitor (T2) is connected to supply voltage and that such current generator (T1) is connected to earth.

8. A process for generating current pumping signals for the control of a phase-locked loop whose control signals are obtained from a first and second impulse emitted periodically by a phase detector (1) at respective instants that depend on phase-locked loop input signal phase ratio and allocated respectively to controlling loop output magnitude increase or decrease characterized by the fact that it includes the operations for:

- recognizing the simultaneous presence of such first and second impulse and generating a third impulse representative of such simultaneous presence
- delaying such third impulse for a preset period of time longer than the minimum duration of such first and second impulse and shorter than the period of such impulses
- converting such first and second impulse into a respective first and second voltage signal whose amplitude is tied to the emission instant of such first and second impulse and whose duration depends on such emission instant and the duration of the preset time interval
- obtaining from such first and second voltage signal at least a first current signal representative of their difference, for the control of phase-locked loop ring filter(s) (3a, 3b).

9. A process according to claim 8 characterized by the fact that such first and second voltage signals are obtained by integrating respectively the first and second impulse for a period of time that starts at the instant of emission of the first and second impulse and ends at the instant of generation of such third impulse.

10. A process according to claim 8 characterized by the fact that such first and second voltage signals are converted into at least a first and second current signal, the first being supplied to ring filter (3a, 3b) and the second to be sent directly to circuit oscillator (4) for simulating the resistance of filter (3a, 3b).

11. A process according to claim 8 characterized by the fact that such first and second voltage signals are converted into first and second current and respective complementary signals.

* * * * *